(12) United States Patent
Frost et al.

(10) Patent No.: US 9,575,128 B2
(45) Date of Patent: Feb. 21, 2017

(54) BATTERY STATE-OF-CHARGE ESTIMATION FOR HYBRID AND ELECTRIC VEHICLES USING EXTENDED KALMAN FILTER TECHNIQUES

(71) Applicant: GM Global Technology Operations LLC, Detroit, MI (US)

(72) Inventors: Patrick Frost, Novi, MI (US); Brian J. Koch, Berkley, MI (US); Damon R. Frisch, Troy, MI (US); Brett B. Stawinski, Royal Oak, MI (US); Patricia M. Laskowsky, Ann Arbor, MI (US); Kurt M. Johnson, Brighton, MI (US); Robert C. Baraszu, Dearborn, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 864 days.

(21) Appl. No.: 13/795,813

(22) Filed: Mar. 12, 2013

(65) Prior Publication Data
US 2014/0278167 A1 Sep. 18, 2014

(51) Int. Cl.
*G01R 31/36* (2006.01)
*B60L 3/00* (2006.01)
*B60L 11/00* (2006.01)
*B60L 11/18* (2006.01)
*H01M 10/48* (2006.01)

(52) U.S. Cl.
CPC ......... *G01R 31/3606* (2013.01); *B60L 3/0038* (2013.01); *B60L 3/0046* (2013.01); *B60L 11/005* (2013.01); *B60L 11/1857* (2013.01); *B60L 11/1861* (2013.01); *G01R 31/3624* (2013.01); *G01R 31/3644* (2013.01); *G01R 31/3651* (2013.01); *B60L 2240/545* (2013.01); *B60L 2240/547* (2013.01); *B60L 2240/549* (2013.01); *B60L 2240/80* (2013.01); *H01M 10/486* (2013.01); *Y02T 10/7005* (2013.01);
(Continued)

(58) Field of Classification Search
CPC ............ G01R 31/3606; G01R 31/3644; G01R 31/3651; H01M 10/42
USPC ............................................ 702/63, 64, 181
See application file for complete search history.

(56) References Cited

U.S. PATENT DOCUMENTS 6,639,385 B2  10/2003 Verbrugge et al.
6,927,554 B2  8/2005 Tate, Jr. et al.
(Continued)

FOREIGN PATENT DOCUMENTS

DE  10 2007 057 981 A1  7/2008

OTHER PUBLICATIONS

Ljung (Asymptotic Behavior of the Extended Kalman Filter as a Parameter Estimator for Linear Systems. Retrieved from the (http://ieeexplore.ieee.org/stamp/stamp.jsp?tp=&arnumber=1101943), Feb. 1979, [online], [retrieved on Oct. 29, 2015]).*

*Primary Examiner* — Regis Betsch
(74) *Attorney, Agent, or Firm* — Quinn Law Group, PLLC

(57) ABSTRACT

Adaptive estimation techniques to create a battery state estimator to estimate power capabilities of the battery pack in a vehicle. The estimator adaptively updates circuit model parameters used to calculate the voltage states of the ECM of a battery pack. The adaptive estimation techniques may also be used to calculate a solid-state diffusion voltage effects within the battery pack. The adaptive estimator is used to increase robustness of the calculation to sensor noise, modeling error, and battery pack degradation.

5 Claims, 4 Drawing Sheets

(52) U.S. Cl.
CPC .......... *Y02T 10/705* (2013.01); *Y02T 10/7022* (2013.01); *Y02T 10/7044* (2013.01)

(56) References Cited

U.S. PATENT DOCUMENTS

| | | |
|---|---|---|
| 7,109,685 B2 | 9/2006 | Tate, Jr. et al. |
| 7,646,166 B2 | 1/2010 | Koch et al. |
| 2003/0076109 A1* | 4/2003 | Verbrugge ........... G01R 31/362 324/427 |
| 2004/0162683 A1 | 8/2004 | Verbrugge et al. |
| 2006/0111870 A1* | 5/2006 | Plett ................... G01R 31/3651 702/181 |
| 2008/0135316 A1* | 6/2008 | Koch .................. B60L 11/1851 324/427 |
| 2012/0136594 A1* | 5/2012 | Tang .................. G01R 31/3679 702/63 |
| 2014/0214268 A1* | 7/2014 | Li ............................. B60L 3/12 701/34.4 |

* cited by examiner

BATTERY STATE-OF-CHARGE ESTIMATION FOR HYBRID AND ELECTRIC VEHICLES USING EXTENDED KALMAN FILTER TECHNIQUES

BACKGROUND

The present disclosure relates generally to a system and method for calculating the state of charge (SOC) of a battery system, and more particularly to the use advanced estimation techniques to determine the diffusion in the battery system.

Batteries are used in a wide range of motor vehicle applications. For example, the desire to improve fuel economy and reduce the amount of pollutants emitted by vehicles has led to the development of electric vehicles (EVs) and hybrid electric vehicles (HEVs) incorporating sophisticated battery systems and vehicles propelled by such systems.

Common to all types of electrified or battery-propelled vehicles is a battery that undergoes various charge and discharge cycles as the battery powers the vehicle and/or vehicular components. It is important to know the state of the battery as expressed by the SOC of the battery. In order to make decisions regarding the usage and utilization of the battery it is important to know the SOC of the battery.

The SOC of a battery indicates the amount of usable energy stored within the battery at a given time. It is analogous to the amount of fuel in a fuel tank. In order to improve battery life and overall battery performance, the battery must be maintained at an optimal SOC. The state of health (SOH) of a battery indicates the condition of the battery. The SOH is based on observing particular battery parameters to determine the extent of unobservable, internal damage or degradation.

A battery can be considered a system that has current and heat flow as inputs and responses of voltage and temperature. The voltage response of the battery to current stimulation can be modeled using a combination of voltage states. These voltage states include an equilibrium potential, voltage resulting from hysteresis effects, the voltage drop resulting from Ohmic resistance, and voltage drop resulting from dynamics in the battery (double-layer and/or diffusion voltage). Each of these voltages can be described by an algebraic function, a differential equation or a convolution integral.

During use (either by driving or plug-in-charging), battery resistance, equilibrium potential, voltage resulting from hysteresis effects, voltage drop resulting from Ohmic resistance, double-layer voltage, and diffusion voltage are not directly measurable. These values influence the SOC and the parameters that indicate the SOH of the battery. Because they are not directly measurable, it is often difficult to accurately determine the SOC and SOH of the battery. Therefore, it is difficult to maintain the battery at an optimal SOC or to determine when the SOH has degraded to a point where battery performance is significantly affected.

Different methods have been developed to determine the SOC. One method to determine the SOC is based upon the use of an equivalent circuit of a battery system to model the battery. The equivalent circuit that models the battery accounts for factors such as the surface charge on the plates of the battery. While such approaches provide a model for determining the SOC of the battery, these circuits fail to account for diffusion in the battery system.

SUMMARY

In a first embodiment, a battery management system is disclosed. The system includes a plurality of sensors where the sensor may be a voltage sensor electrically coupled to a battery pack, a current sensor electrically coupled to the battery pack, and a temperature sensor thermally coupled to the battery pack. A battery management controller may be electrically coupled to the plurality of sensors and configured to sense one or more battery characteristics comprising a temperature of the battery pack, a voltage of the battery pack, and a current of the battery pack and the battery management controller comprising a processor and a computer-readable medium configured to run an algorithm. The algorithm further may include one or more states stored in the computer-readable medium, at least one equivalent circuit model parameter stored in the computer-readable medium, and an extended Kalman filter executed in the processor using the voltage of the battery pack, the current of the battery pack, the battery states and circuit model parameters to calculate an open circuit voltage ($V_{OC}$, or OCV). A look-up table stored in the computer-readable medium and used by the battery management controller to determine a state of charge of the battery pack based on the open circuit voltage and a temperature of the battery pack wherein the state of charge is used to manage a power output of the battery pack.

In another embodiment, a method of estimating the state of charge of a battery pack in a vehicle is disclosed. The method includes sensing a plurality of sensors electrically coupled to a battery pack where the sensors may be a voltage sensor electrically coupled to a battery pack, a current sensor electrically coupled to the battery pack, and a temperature sensor thermally coupled to the battery pack. The method includes executing an algorithm in a processor with a computer-readable medium in a battery management controller electrically coupled to the plurality of sensors and configured to sense one or more battery characteristics comprising a temperature of the battery pack, a voltage of the battery pack, and a current of the battery pack. The algorithm includes one or more states stored in the computer-readable medium, at least one equivalent circuit model parameter stored in the computer-readable medium, and an extended Kalman filter executed in the processor using the voltage of the battery pack, the current of the battery pack, the battery states and circuit model parameters to calculate an open circuit voltage. The method includes using a look-up table stored in the computer-readable medium and used by the battery management controller to determine a state of charge of the battery pack based on the open circuit voltage and a temperature of the battery pack wherein the state of charge is used to manage a power output of the battery pack.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

A battery management controller may sense battery characteristics from a plurality of sensors and use adaptive estimation techniques (AET) to estimate various states of a battery pack in a battery system, including solid-state diffusion voltage effects. The AET may be an extended Kalman filter (EKF) or sliding mode observer and otherwise be called a battery state estimator. The battery state estimator uses an equivalent circuit model (ECM) that represents the electrical characteristics of the battery pack and adaptively tries to determine an open-circuit voltage based on accurately estimating at least one ECM voltage state and/or parameter and the solid-state diffusion voltage effect of the battery pack. From the OCV, the SOC and the power capabilities of the battery pack may be determined; allowing accurate prediction of the vehicle's operating parameters.

Figure 1:
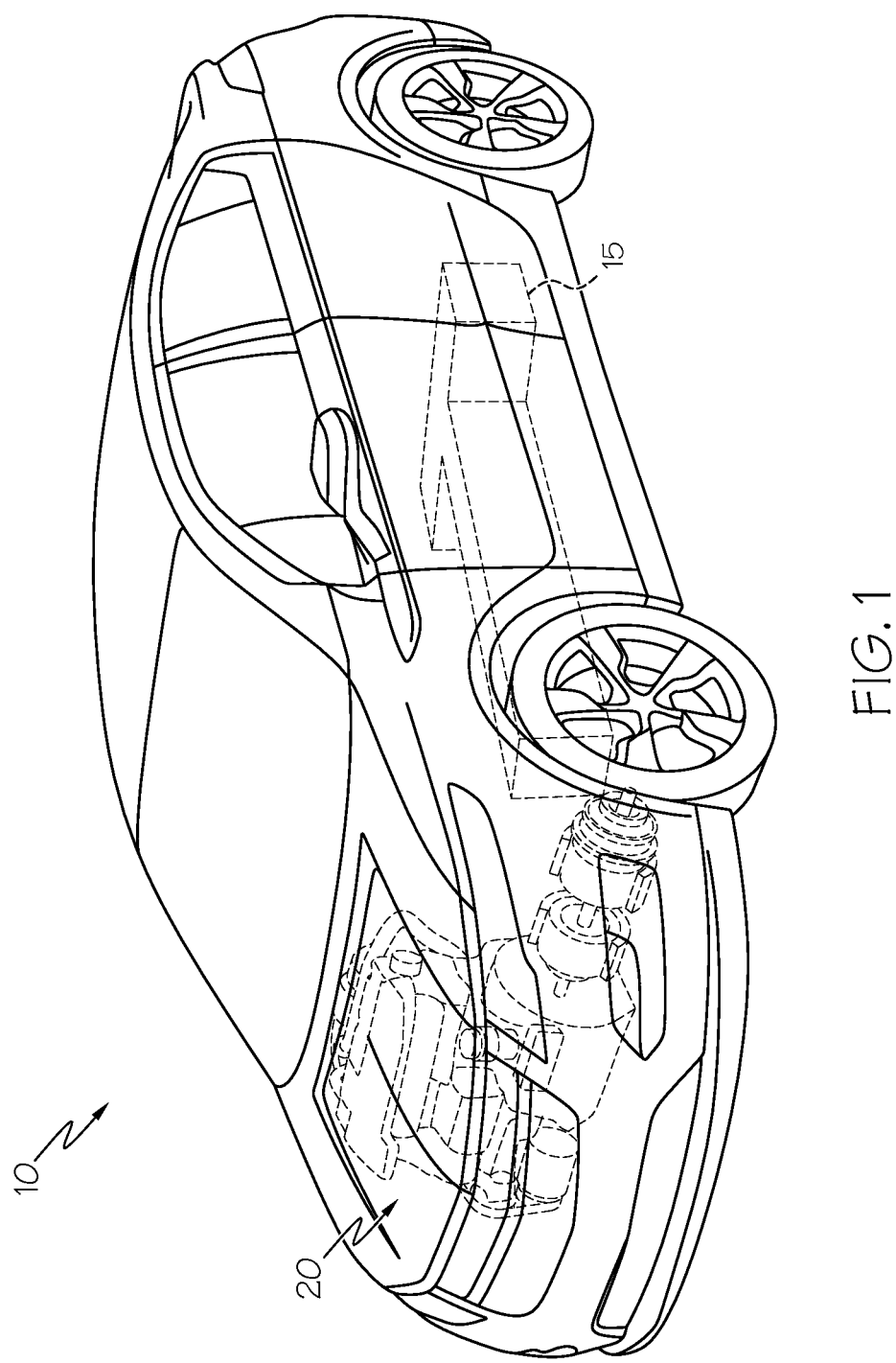
FIG. 1 depicts a vehicle with a hybrid propulsion system according to one or more embodiments shown and described herein.

Referring first to FIG. 1, a vehicle 10 may include a hybrid propulsion system in the form of a battery pack 15 and a conventional internal combustion engine (ICE) 20. Such a vehicle may also be known as an HEV. Battery pack 15 employs numerous battery cells arranged into modules (not shown) that are typically arranged in a repeating array. In one typical example, battery pack 15 may contain between about two hundred to three hundred individual battery cells, although it will be appreciated by those skilled in the art that additional or fewer cells may be needed, depending on the power or energy required. It will be further appreciated by those skilled in the art that vehicle 10 may not require an ICE 20; in such case, rather than being an HEV, it is an electric vehicle; either form is within the scope of the present invention.

Figure 2:
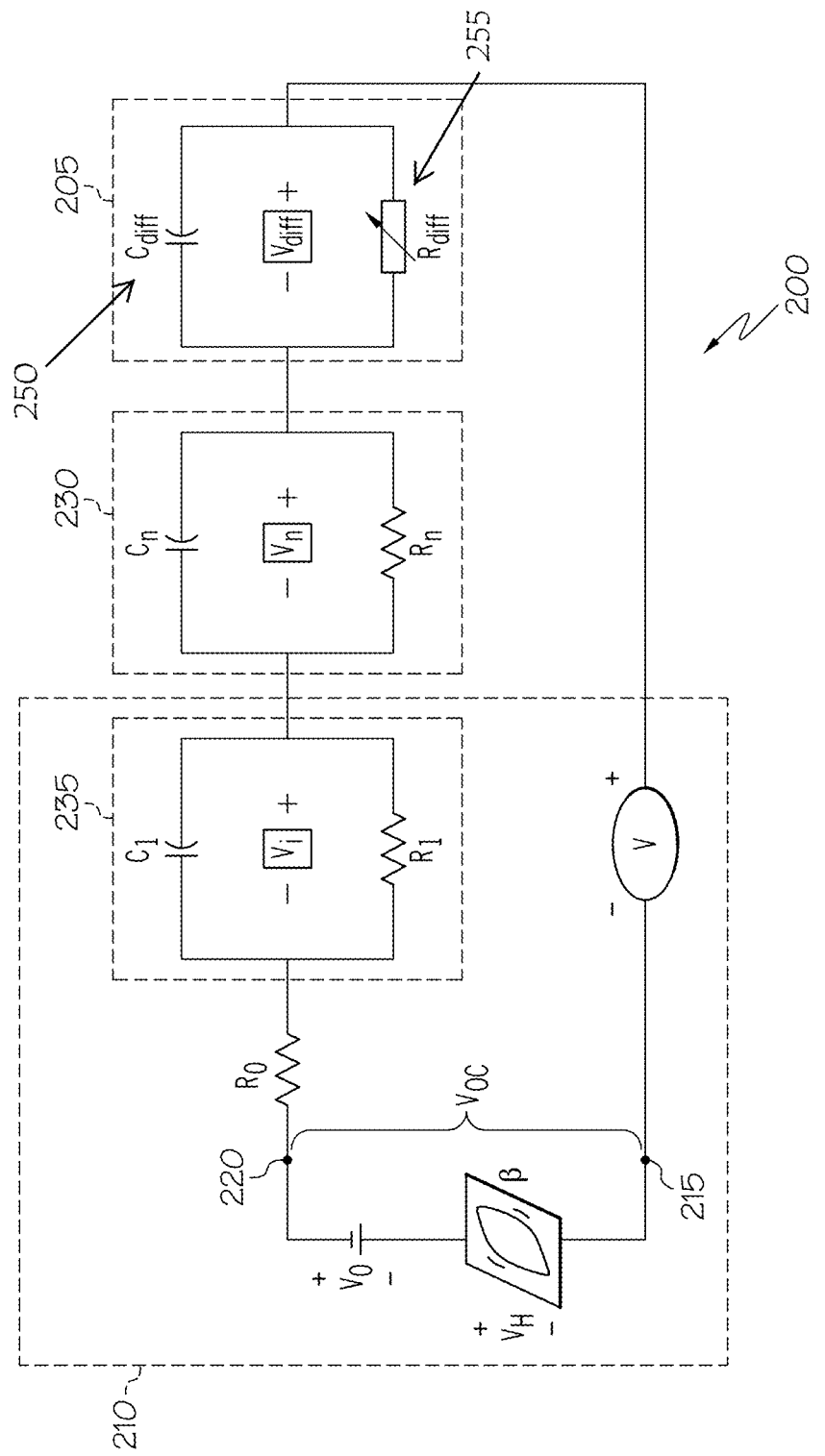
FIG. 2 illustrates an exemplary embodiment of a battery equivalent circuit according to one or more embodiments shown and described herein.

The battery pack 15 may be modeled as shown in FIG. 2 using an ECM 200. The battery pack 15 may also be a single battery cell or a battery. FIG. 2 illustrates an exemplary embodiment of the ECM 200 including a diffusion circuit element 205 and a conventional equivalent circuit 210. The conventional equivalent circuit 210 includes a hysteresis voltage source, $V_H$, in series with a battery voltage source, $V_O$; and a series resistance, $R_O$. Between a negative terminal point 215 and a positive terminal point 220, an open circuit voltage, $V_{OC}$, is defined. The open circuit voltage is equal to the sum of the hysteresis voltage source, $V_H$, and the battery voltage source, $V_O$. A first capacitor, $C_1$, is coupled in parallel with a first resistance, $R_1$ (a first state 235) and defines a first voltage $V_1$.

The elements of conventional equivalent circuit 210 are part of a known conventional equivalent circuit that can be used to model the battery pack's 15 of FIG. 1 behavior and account for factors such as the surface charge on the plates of one or more battery cells (not shown). The conventional equivalent circuit 210 and its behavior are disclosed in U.S. Pat. No. 6,639,385, entitled "State of Charge Method and Apparatus," issued on Oct. 28, 2003, and U.S. Publication No. U.S. 2004/0162683, entitled "Method and Apparatus for Generalized Recursive Least-Squares Process for Battery State of Charge and State of Health," filed Feb. 8, 2003, which are hereby incorporated for all purposes.

The exemplary ECM 200 of the present invention includes a diffusion circuit element 205 (disclosed in U.S. Pat. No. 7,646,166, entitled "Method and Apparatus for Modeling Diffusion in an Electrochemical System" and herein incorporated by reference in its entirety) to model the solid-state diffusion voltage effect in the battery. The circuit element described below is not intended to limit the modeling and characterization of the solid-state diffusion voltage effect used in the battery state estimator described in this document. The diffusion circuit element 205 comprises a diffusion capacitor 250, $C_{diff}$, coupled in parallel to a diffusion resistance 255, $R_{diff}$. The diffusion circuit element 205 models the solid-state diffusion process in an electrochemical cell. An electrochemical cell may also be called a battery cell for the purposes of this disclosure. Diffusion is the movement of ions in response to a concentration gradient. In other words, transport of the diffusing ions occurs from areas of high concentration to areas of low concentration at a rate that is directly proportional to the diffusivity of the ions and the magnitude of the gradient. In an electrochemical process, a gradient is created by the conversion of a reactant to a product at an electrode. An electrode may be either a positive battery terminal and/or a negative battery terminal of a battery cell.

The battery state estimator may be based on an ECM and use an extended Kalman filter (EKF) which may adaptively estimate one or more states 230 (and may include the first state 235) and ECM parameters to model the battery pack 15. For example, the first state 235 includes the first capacitor, $C_1$, coupled in parallel with the first resistance, $R_1$ and defines the first voltage $V_1$. The one or more states 230 may be of the same form as the first state 235 with different values for the resistor and/or capacitor and help model additional characteristics of the battery pack 15. This disclosure is not limited to only the first state 235 or one or more states 230. Furthermore, the diffusion circuit element 205 of the solid-state diffusion voltage effects may be modeled within the ECM EKF framework used in the battery state estimator as discussed below or separately using a second EKF framework or other AET (for example, a recursive least-squares estimator, sliding-mode observer, or another variety of Kalman filter—depending on the requirements of the ECM and vehicle application).

Figure 3:
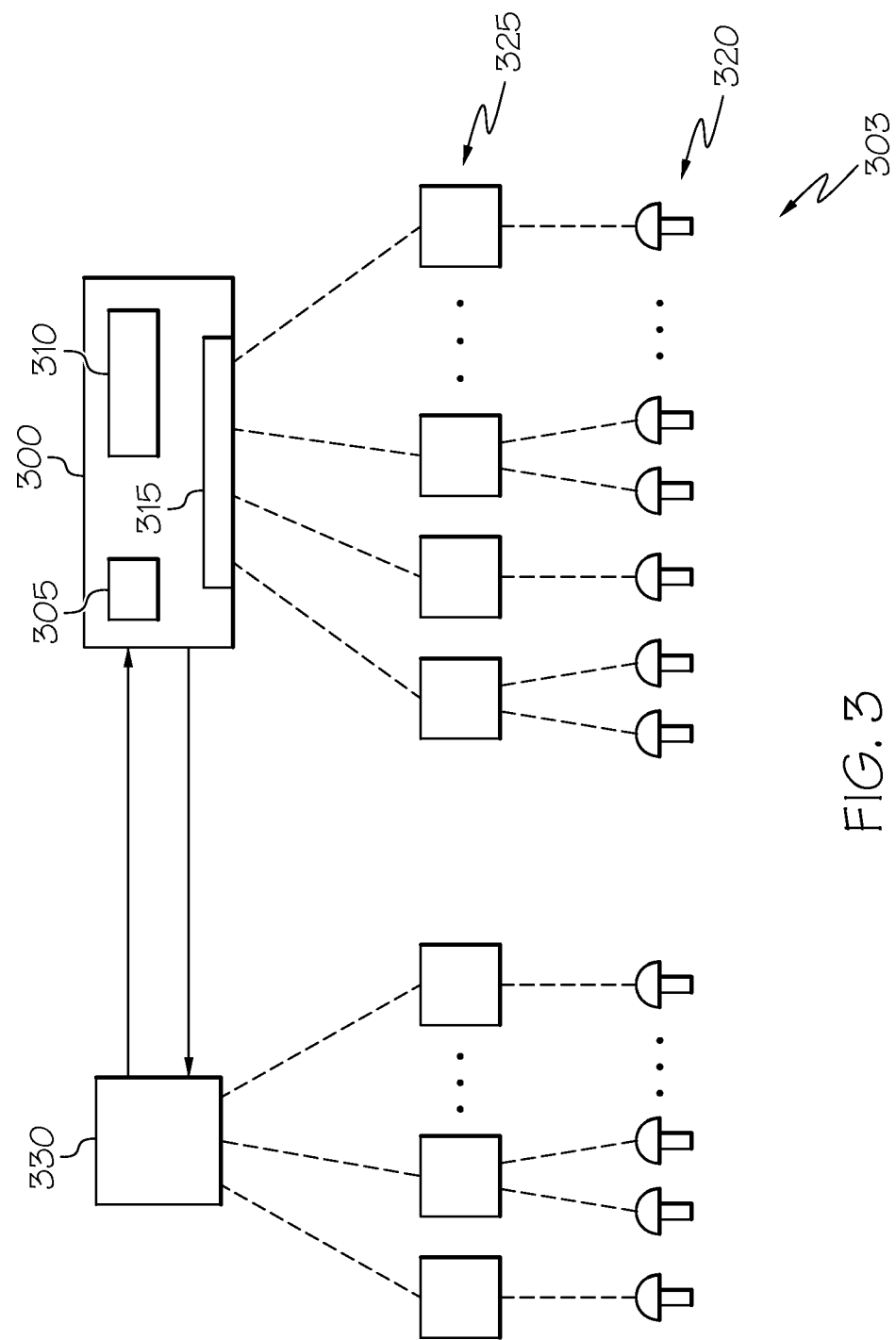
FIG. 3 depicts a battery management system according to one or more embodiments shown and described herein.

Referring to FIG. 3, the battery management system 303 is shown. The battery management controller 300 may be used to execute the battery state estimator. The battery state estimator may be an algorithm used to accurately estimate the SOC and power capability using AET. The battery management controller 300 may have a processor 305 and a computer-readable medium 310 along with input/output ports 315 to electrically couple the battery management controller 300 to a plurality of sensors 320. The battery management controller 300 senses one or more battery pack 15 characteristics through the plurality of sensors 320.

In one embodiment, for example, the battery management controller 300 may be directly electrically coupled to the plurality of sensors 320. For example, the battery management controller 300 may be electrically coupled to a voltage sensor, a current sensor, and a temperature sensor of the one or more sensors 320. The voltage sensor and the current sensor may be electrically coupled to the terminals of the battery pack 15 (not shown) and the temperature sensor may be thermally coupled to the battery pack 15 (not shown). The battery management controller 300 may sense one or more battery characteristics of the battery pack 15 using the one or more sensors 320. The one or more battery characteristics may include a temperature of the battery pack 15, a voltage of the battery pack 15, and a current of the battery pack 15.

In another embodiment, the battery management controller 300 may be indirectly electrically coupled to the plurality of sensors through one or more vehicle modules 325. The battery management controller 300 may be electrically coupled to the one or more vehicle modules 325 and the one or more vehicle modules 325 may be electrically coupled to the one or more sensors 320. In yet another embodiment, the battery management controller 300 may be electrically coupled to an Operation Control Module (OCM) 330 and the OCM 330 may be electrically coupled to the one or more vehicle modules 325 which are in turn electrically coupled to the one or more sensors 320. The OCM 330 is a vehicle module that controls many vehicle functions. In both indirect embodiments as shown in FIG. 3, the battery management controller 300 obtains the one or more battery characteristics from the one or more sensors 320 to be used as described below. The one or more battery characteristics may include the temperature of the battery pack 15, the voltage of the battery pack 15, and the current of the battery pack 15.

Figure 4:
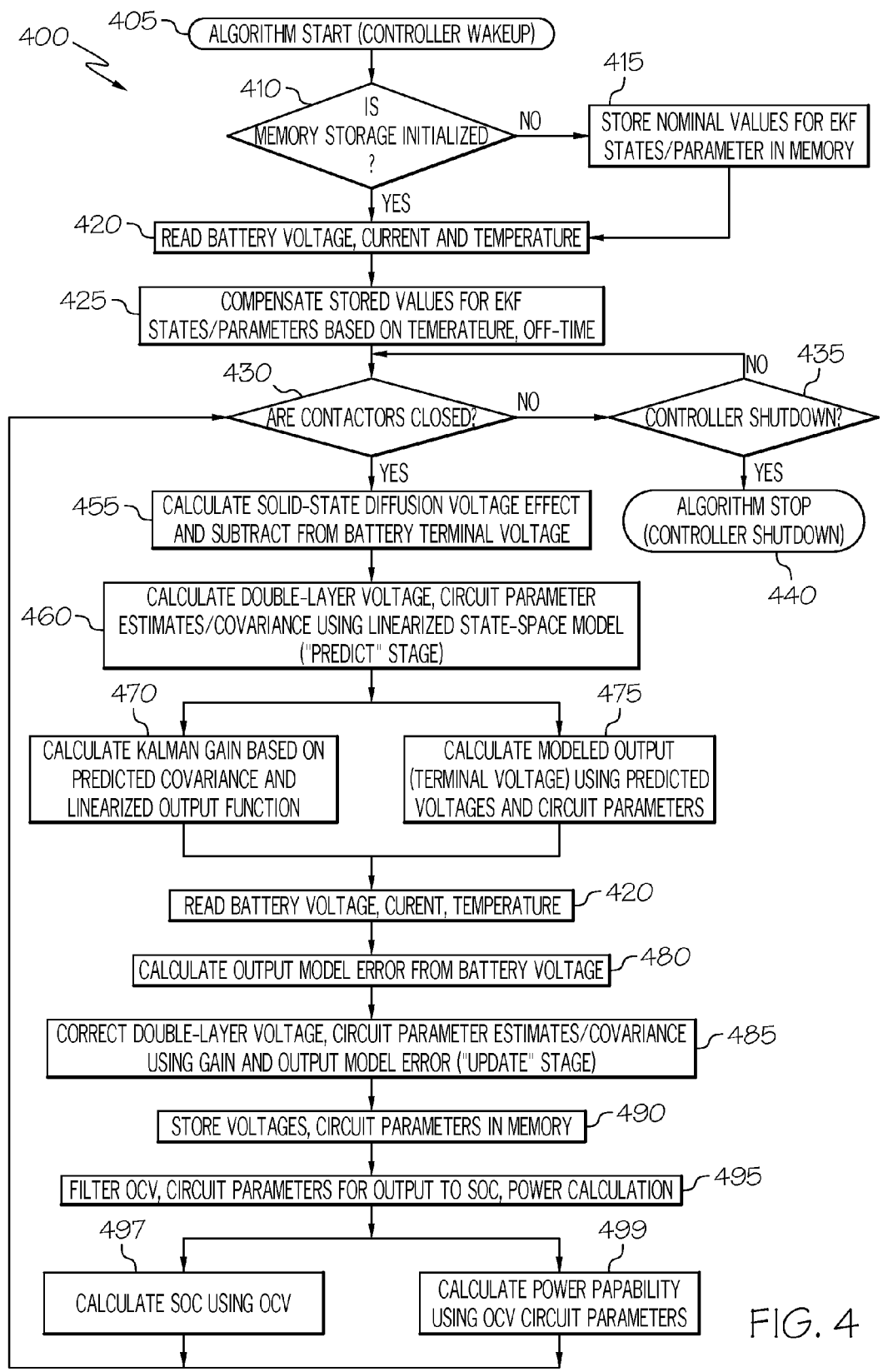
FIG. 4 depicts a battery state estimator according to one or more embodiments shown and described herein.

Referring to FIG. 4, the battery state estimator may be an algorithm 400, executed by the processor 305 and using the computer-readable medium 310 of FIG. 3, to accurately estimate SOC and power capabilities of the battery pack 15 using open-circuit voltage ($V_{OC}$) and at least one ECM parameter. ECM parameters may include, but are not limited to Ohmic resistance of the battery pack 15, charge-transfer resistance of the battery pack 15, double layer capacitance of the battery pack 15 and other model parameters of the battery pack 15 and/or battery cell. The open-circuit voltage may be calculated across a temperature range as the temperature of the battery pack 15 affects the performance. The temperature range may be the operating temperature of the vehicle 10. The temperature range may also be the temperature of the battery nominal operating range as specified by the manufacturer. The ECM may also be applied to the individual battery cells of the battery pack 15, a set or section of battery cells and/or an average battery cell value. Ohmic resistance of the battery pack 15 is the apparent resistance of the electrical conductors in the battery pack 15, and is manifested as an instantaneous response of the voltage to changes in current flow. Charge-transfer resistance of the battery pack 15 represents the resistance to electron transfer across the interfaces between the electrodes and the electrolyte and is a measure of the electrochemical reaction kinetics. Double layer capacitance represents the extent to which non-faradaic charge accumulation and dissipation may occur at the electrode interfaces in a manner which is identical to the processes that take place in an electrolytic capacitor. The use of AET greatly increases the accuracy and fidelity of the values assigned to the foregoing ECM parameters during charge and discharge cycles of the battery pack 15 as it is capable of incorporating in them the effects of age, temperature and SOC. The ECM parameters and one or more states 230 may be estimated to model the SOC and power capabilities of the battery pack 15.

The battery management controller 300 of FIG. 3 may be woken up 405 when the vehicle is in a predetermined state. The predetermined state may include and is not limited to an on-state, run-state, idle-state, or the like. The predetermined state may also include any vehicle state where the OCM 330 needs the SOC of the battery pack 15. The woken up 405 step may be ignored if the battery management controller 300 is already in a ready state, i.e. the battery management controller 300 is ready to begin running the algorithm 400 and sense the one or more battery characteristics. The battery management controller 300 may then check to see if the computer readable medium 310 has been initialized 410. If the computer readable medium 310 has not been initialized 400, the battery management controller 300 may store 415 one or more states 230 and at least one ECM parameter into the computer readable medium 310. If the battery management controller 300 has been initialized 410 (i.e. the one or more states 230 and at least one ECM parameter is already stored 415 into the computer readable medium 310) the battery management controller 300 will sense 420 the battery characteristics from the one or more sensors 320.

The algorithm 400 may compensate 425 for the one or more states 230 and the at least one ECM parameter stored 415 into the computer readable medium 310 based on the temperature of the battery pack 15 and the off-time. When the vehicle 10 is off, the off-time is recorded to modify the one or more states 230 and the at least one ECM parameter stored 415 into the computer readable medium 310. For example, as the length of off-time increases, the states 230 begin to discharge when the current of the battery pack 15 is zero. Because the voltage associated with each state 230 may be lower when the vehicle 10 is turned on at start-up, the algorithm 400 must compensate 425 to ensure accuracy of the SOC and power capabilities calculated by the algorithm 400. Of significance, the diffusion voltage dynamics may persist sufficiently to realistically have a non-zero value after an extended vehicle 10 shutdown. In another embodiment, the off-time may be only the time the controller is not executing the algorithm 400 as described in FIG. 4. Further, the one or more states 230 and the at least one ECM parameter may be adjusted based on the temperature of the battery pack 15. The temperature of the battery pack 15 may be recorded at the time the one or more states 230 and the at least one ECM parameter stored 415 into the computer readable medium 310 are stored 415 and/or at the time the controller is woken-up 405 (start-up). The one or more states 230 and the at least one ECM parameter may be scaled by a ratio of a beginning-of-life value at shutdown and wake up (start-up) temperatures. The beginning-of-life values may be stored in a look-up table (LUT). As the algorithm 400 iteratively processes the one or more states 230 and the at least one ECM parameter as the vehicle 10 operates, the algorithm 400 will "walk" the one or more states 230 and the at least one ECM parameter to the correct values but the compensation 425 allows the algorithm 400 to predict the SOC and power capabilities of the battery pack 15 much sooner after the controller is woken-up 405.

The battery management controller 300 may be electrically coupled to a contact sensor or alternatively to at least one contactor to sense or determine if the at least one contactor is closed 430. The at least one contactor may be the high voltage bus contactors. If they are closed, then the battery is connected to the high voltage bus can be used to power the electric motors. Use of the battery requires the estimation of the SOC. If the at least one contactor is open, no charge is leaving the battery so the SOC does not need to be calculated and the algorithm 400 does not need to be run. If the at least one contactor is not closed 430, the algorithm 400 will determine if the controller 300 is shutting down 435. If the battery management controller 300 is shutting down 435, the algorithm 400 will stop 440. When the algorithm 400 stops 440, the one or more states 230 and the at least one ECM parameter stored 415 into the computer readable medium 310 will be saved to non-volatile memory for later use by the algorithm 400. If the battery management controller 300 is not shutting down 435, the algorithm 400 will return to sense or determine of the at least one contactor is closed 430.

When the algorithm 400 senses or determines that the at least one contactor is closed 430, the algorithm 400 may calculate a solid-state diffusion voltage effect using a solid-state diffusion effects model. The solid-state diffusion voltage effect is subtracted 455 from the voltage of the battery pack 15 as sensed at the battery pack 15 terminal (if the battery chemistry exhibits significant diffusion effects during operation) and the difference is used in the estimation as the observed output of the battery pack 15. This step is done in order to make sure that the distribution of voltages is accurate across the estimated states 230 of FIG. 2. If the solid-state diffusion effect is removed before regression, the regressed ECM parameters and the resulting open-circuit voltage will not have any portion of the solid-state diffusion effect embedded within the results. In other words, the algorithm 400 does not have to make a decision on how much to change the regressed ECM parameters when removing the solid-state diffusion effect.

In the predict stage 460 (pre-measurement), a double layer voltage and circuit parameter estimates are calculated, along with the covariance of each. Per the EKF formulation, the pre-measurement covariance may be determined using estimated process covariance (an evaluation of state uncertainty with respect to the other states as for example how much a first voltage varies with respect to a first resistance) and a linearized approximation of the non-linear state equations for double-layer voltage and circuit parameters. The corrective gain 470 is calculated based on the pre-measurement covariance and a linearized output function (which is intended to model the output). Furthermore, a modeled output 475, i.e. terminal voltage (minus diffusion effects, if applicable), is calculated using the pre-measurement double-layer voltage and circuit parameters from the predict stage. The battery management controller 300 senses 420 one or more battery pack 15 characteristics through the plurality of sensors again as described above. An output model error 480 may then be calculated from the sensed battery pack 15 characteristics. In an update stage 485, based on the output model error 480, the states 230 and ECM parameters are updated 490 in the computer-readable medium 310.

The algorithm 400 may then filter 495 the states 230 and ECM parameters resulting in filtered states 230 and filter ECM parameters. Filtering is done to smooth the outputs of the algorithm 400 when they are used in other calculations for vehicle 10 operations. Downstream algorithms may be sensitive to inputs that vary quickly. The SOC 497 is calculated using the filtered states 230. The power capability 499 of the battery pack 15 is calculated using the filter states 230 and the filtered ECM parameters. The algorithm 400 may output the SOC 497 and the power capability 499 for use by OCM and return to sense or detect if the at least one contactor is closed 430. $V_{OC}$ is estimated as a function of sensed and/or measured voltage of the battery pack 15, current of the battery pack 15, and/or average temperature of the battery pack 15. SOC is a non-linear function of open-circuit voltage and temperature of a battery pack 15. Because of the non-linearity of the SOC, a look-up table, stored in the computer-readable medium, may be used by the battery management controller 300 to determine the SOC of the battery pack 15. The battery management controller 300 uses $V_{OC}$ and a temperature of the battery pack 15 to determine which cell of the look up table is the correct value representing SOC. The SOC may be used to manage a power output of the battery pack 15.

The disclosed EKF framework allows for direct comparisons of generally accepted modeled parameters as the battery pack 15 ages and greatly decreases complexity of subsequent calculations in the algorithm such as for example, constant-current SOC 497 calculation (charging and/or discharging) and power capability 499. The battery state estimator 400 may use the estimated open-circuit voltage of the battery pack 15 to model the SOC. Extended Kalman filters are state-space estimators designed to explicitly account for noise and lack of excitation in the process and output dynamics which make them advantageous over other AETs such as least-squares estimation. Extended Kalman filters are designed to correct prediction when measurement updates are available to reliably estimate system dynamics.

When the algorithm 400 senses or determines that the at least one contactor is closed 430, the algorithm 400 may calculate a solid-state diffusion voltage empirically with one or more variable parameter parallel RC circuit elements (states 230) using an AET. For example, in one embodiment, the solid-state diffusion model may be included in the non-linear state equations that are adaptively updated using the EKF framework disclosed above or separately with an EKF or different AET. Using the disclosed EKF framework may increase the robustness of the solid-state diffusion model to sensor noise, modeling error, and/or battery degradation.

Sensor noise may be random fluctuation in an electrical signal that partially or fully distorts the electrical signal and obscures useful information. The sensor noise may be a function of the manufacturing tolerances of the battery pack 15 and/or electrical components electrically coupled in the battery system. The electrical signal may be a sensor signal between the plurality of sensors 320 and the battery management controller 300. Modeling error may be the result of inaccuracies in estimating and/or calculating the internal characteristics of the battery pack 15. For example, the internal characteristics of the battery pack 15 may be, but are not limited to, the Ohmic resistance, double-layer capacitance, and/or the charge-transfer resistance. Battery degradation may be a function of the breakdown of the internal chemicals of the battery pack 15. With increased accuracy in estimating the sold-state diffusion model, the accuracy of state-of-charge increases.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

The present disclosure may be embodied in hardware and/or in software (including firmware, resident software, micro-code, or the like). The system controller may have at least one processor and the computer-readable medium. A computer-usable or the computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of the present disclosure may be written in a high-level programming language, such as C or C++, for development convenience. In addition, computer program code for carrying out operations of the present disclosure may also be written in other programming languages, such as, but not limited to, interpreted languages. Some modules or routines may be written in assembly language or even micro-code to enhance performance and/or memory usage. However, software embodiments of the present disclosure do not depend on implementation with a particular programming language. It will be further appreciated that the functionality of any or all of the program modules may also be implemented using discrete hardware components, one or more application specific integrated circuits (ASICs), or a programmed digital signal processor or microcontroller.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for managing a battery in a vehicle, wherein the vehicle includes a battery management controller including a processor and a computer-readable medium containing computer readable and executable instructions, the method comprising:
   in response to detecting a predetermined state in the vehicle:
      sensing, with at least one sensor electrically coupled to the battery, a voltage and a current of the battery;
      executing, in the battery management controller, an instruction to cause the battery management controller to:
         determine a solid-state diffusion voltage effect employing a solid-state diffusion effects model based upon the sensed voltage of the battery,
         determine an observed output by subtracting the solid-state diffusion voltage effect from the sensed voltage of the battery,
         determine double-layer voltage and circuit parameter estimates and an associated covariance based upon the observed output employing an adaptive estimation technique,
         determine a Kalman gain based upon the double-layer voltage and circuit parameter estimates and the associated covariance, and simultaneously calculate a modeled output of terminal voltage based upon the double-layer voltage and the circuit parameter estimates,
         sense, with the at least one sensor electrically coupled to the battery, a voltage and a current of the battery,
         determine an output model error based upon the sensed voltage of the battery,
         update the double-layer voltage and the circuit parameter estimates based upon the Kalman gain and the output model error,
         determine an open-circuit voltage of the battery based upon the double-layer voltage, and
         determine a state of charge for the battery based upon the open-circuit voltage; and
      managing the power output of the battery using the state of charge for the battery.

2. The method of claim 1, wherein a start-up temperature and a shut-down temperature are recorded in the computer-readable medium and used to vary the solid-state diffusion effects model upon start-up.

3. The method of claim 1, wherein an off-time is recorded in the computer-readable medium and used to compensate the solid-state diffusion effects model upon start-up.

4. The method of claim 1, wherein the solid-state diffusion effects model comprises an equivalent circuit of the battery, at least one state of the battery and a diffusion circuit element of the battery.

5. The method of claim 1, wherein the adaptive estimation technique comprises an extended Kalman filter.

* * * * *